United States Patent
Takahashi et al.

(10) Patent No.: US 6,813,212 B2
(45) Date of Patent: Nov. 2, 2004

(54) SEMICONDUCTOR MEMORY DEVICE AND REFRESH CONTROL CIRCUIT

(75) Inventors: Hiroyuki Takahashi, Kanagawa (JP); Takashi Kusakari, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/450,276

(22) PCT Filed: Dec. 6, 2001

(86) PCT No.: PCT/JP01/10690
§ 371 (c)(1),
(2), (4) Date: Jun. 11, 2003

(87) PCT Pub. No.: WO02/49037
PCT Pub. Date: Jun. 20, 2002

(65) Prior Publication Data
US 2004/0027876 A1 Feb. 12, 2004

(30) Foreign Application Priority Data
Dec. 11, 2000 (JP) .................................. 2000-375745

(51) Int. Cl.[7] .............................................. G11C 8/00
(52) U.S. Cl. .................................. 365/222; 365/233.5
(58) Field of Search ............................. 365/222, 233.5

(56) References Cited

U.S. PATENT DOCUMENTS 5,619,468 A * 4/1997 Ghosh et al. ................ 365/222
6,208,577 B1 * 3/2001 Mullarkey .................... 365/222
6,327,210 B1 * 12/2001 Kuroda et al. ............... 365/222
6,404,690 B2 * 6/2002 Johnson et al. .............. 365/222
6,628,559 B2 * 9/2003 Shimizu et al. .............. 365/222
6,643,205 B2 * 11/2003 Kim ............................ 365/222
6,643,216 B1 * 11/2003 Lazar et al. ............... 365/233.5
6,707,745 B2 * 3/2004 Mizugaki ..................... 365/222

FOREIGN PATENT DOCUMENTS

JP          61-71494 A         4/1986

* cited by examiner

Primary Examiner—Trong Phan
(74) Attorney, Agent, or Firm—Choate, Hall & Stewart (57) ABSTRACT

Problems are prevented that a refresh provides an influence to a normal access and that a continuation of write operations inhibits refresh. In a semiconductor memory device, a clock signal providing a reference to a time interval of refresh operations based on addresses corresponding to a single row s generated as a refresh clock signal. A transition of an access address "Address" externally supplied and corresponding to a memory cell is detected, so that a refresh operation is executed to a memory cell corresponding to a refresh address by triggering the generation of this detection signal before an access to a memory cell designated by the access address is made, wherein the upon input of a write enable signal /WE, the refresh is executed by triggering this signal before a write operation is executed and the refresh operation by triggering the generation of the access address is discontinued in a predetermined period of time based on the refresh clock signal.

14 Claims, 6 Drawing Sheets

SEMICONDUCTOR MEMORY DEVICE AND REFRESH CONTROL CIRCUIT

TECHNICAL FIELD

The present invention relates to a semiconductor memory device and a refresh control circuit, and more particularly to a semiconductor memory device, wherein a memory cell array comprises the same memory cells as DRAM (dynamic random access memory), and the semiconductor memory device is operable in the same specification as SRAM (static random access memory), and the semiconductor memory device is compatible to SRAM, where a write enable signal, which decides a timing of writing to a memory cell, is non-synchronously given to a write address, and a refresh control circuit for controlling a refresh operation.

BACKGROUND ART

SRAM and DRAM are most typical ones of semiconductor memory devices which accept random accesses. As compared to DRAM, in general, SRAM exhibits a high speed operation. Further, supplying a power to SRAM and entry of an address into the same are sufficient for enabling SRAM to detect any address transition and cause an internal sequencer circuit to operate for performing read and write operations. SRAM may be operable based on input signals with more simple waveforms as compared to DRAM. This allows simplifying a configuration of a circuit which generates the input signal with such the waveform.

SRAM does not need refresh operation, which is needed for DRAM to hold data in the memory cells in DRAM, for which reason managing SRAM is easier. SRAM is advantageous in that a small current is needed for holding data in a stand-by state due to no need for the refresh operation. For those reasons, SRAM has widely been used in a variety of application. In general, SRAM, however, needs six transistors for one memory cell, for which reason a chip of SRAM is larger in size than DRAM, and thus SRAM is higher in price than DRAM.

Meanwhile, DRAM is supplied with a row address and a column address separately or at different two timings, wherein there are needed RAS (row address strobe) and CAS (column address strobe) which define separate timings of capturing the row address and the column address, respectively. Further, a control circuit is needed for cyclically refreshing memory cells. DRAM is more complicated than SRAM in view of timing controls.

DRAM also has a problem with a larger current consumption due to the need for refreshing memory cells even when no external access is made. Notwithstanding, the memory cell of the DRAM may comprise a single capacitor and a single transistor. This makes it relatively easy to achieve a large memory capacity with a small chip size. DRAM is more cheaper than SRAM, provided that the required memory capacity is the same.

SRAM is the main-stream of the semiconductor memory device which is utilized in a portable device, typically, a portable telephone device. This reason is as follows. The past portable telephone device does not need a semiconductor memory device with a large capacity because the past portable telephone device has simple functions. SRAM is more simple in timing control operation than DRAM. SRAM has a smaller current consumption in the stand-by state, for which reason SRAM is more suitable for the portable telephone device which is needed to prolong a continuous communication time and a continuous stand-by time as many as possible.

Recently, however, an advanced portable telephone device has a variety of function, for example, a function of transmitting and receiving e-mails, and another function of making an access to a variety of site for obtaining informations about restaurants. A very recent portable telephone device is also incorporated with a function of making an access to a Web-server on the Internet and displaying summarized contents of a home page. In the future, the portable telephone device may be expected to make accesses to home pages on the Internet similarly to the present desk top type personal computer.

In order to realize those functions, a simple display in text format by the conventional portable telephone device is insufficient but a graphic display for providing a variety of multi-media information to users is essential. It is necessary for this purpose that a large mount of data received from a public network is temporarily stored in the semiconductor memory device in the portable telephone device. It is essential that the semiconductor memory device integrated in the portable device has a large capacity such as DRAM. It is absolute that the portable device has a small size and a light-weight, for which reason it is necessary that the capacity of the semiconductor memory device is increased without increasing the size and the weight.

As described above, SRAM is preferable in view of easy operation and power consumption of the semiconductor memory device integrated in the portable device. DRAM is preferable in view of large capacity. Namely, a semiconductor memory device taking both advantages of SRAM and DRAM is optimum for those portable devices. A semiconductor memory device of this kind so called as "pseudo SRAM" has already been considered, wherein the same memory cells are used as those of DRAM, while the specification is almost the same as that used for DRAM in an external view.

The pseudo SRAM does not need to perform such a separate supply of a row address and a column address as conducted in DRAM, for which reason the pseudo SRAM does not need timings signals such as RAS and CAS. The pseudo SRAM may perform a batch-supply of addresses similarly to the general-purpose SRAM. The pseudo SRAM takes the addresses therein by triggering a chip enable signal for read/write operations, wherein the chip enable signal corresponds to a clock of a semiconductor memory device operable synchronizing with the clock signal.

The pseudo SRAM is not necessarily complete-compatible to the general-purpose SRAM. The majority of the pseudo SRAM is provided with refresh control terminals for externally controlling refreshes of memory cells. The external control to the refresh of the pseudo SRAM is needed. The majority of the pseudo SRAM is not easy in operation as compared to SRAM, and needs an additional circuit for refresh control. Another pseudo SRAM has been proposed which is operable in the completely similar specification to the general-purpose SRAM, without external control to the refresh of the pseudo SRAM. This pseudo SRAM also has the following disadvantages.

For writing data into the general-purpose SRAM, generally, an access address is designated as an external address, and subsequently, a write enable signal is activated to give a write instruction. Data to be written are supplied, and input data into SRAM are commenced to be captured, before the input data are defined synchronizing with a rising or a falling of a signal which inactivates the write enable signal.

One of the specifications needed for use of the general-purpose SRAM is an address hold time (Twr). The address hold time Twr defines a time duration, in which the external address presenting the access address has to be held at the same value after the write enable signal has been inactivated. Normally, the general-purpose SRAM may be configured to define zero second as the minimum value of the address hold time Twr.

The conventional pseudo SRAM performs the control to the refresh operation without sufficient consideration of a relationship between a timing of transition of the write enable signal and another timing of transition of the external address signal. For this reasons, immediately after the data write operation (the inactivation of the write enable signal) has been completed, the refresh operation may be commenced. In this case, it is possible that the external access address overlaps an internally generated refresh address.

This point is particularly remarkable problem in such a configuration that any transition of the address signal is detected for the refresh operation. One countermeasure may be considered that the external address is so defined to remain for a period of time after the write enable signal has been inactivated. In this case, however, the address hold time Twr is defined, for example, in a few nanoseconds to several tends nanoseconds. This has a large difference from the general-purpose SRAM which normally ensures zero second. There is an issue to change the configuration of using the semiconductor memory device.

SUMMARY OF THE INVENTION

The present invention was made in the above points of view. An object of the present invention is to provide a semiconductor memory device with memory cells comprising DRAM, wherein such problems are not raised that the refresh provides an influence to the normal access, and that the refresh operation is not permitted by continuous data write operations, and wherein the semiconductor memory device ensures conditions in use as closely to the general-purpose SRAM as possible, and another object thereof is to provide a refresh control circuit thereof. Particularly, an object of the present invention is to provide a semiconductor memory device and a refresh control circuit, which allow the specification of the address hold time Twr for data write operation to be defined equivalent to that of the general-purpose SRAM.

In order to solve the above issues, the present invention provides a semiconductor memory device comprising: a memory cell array having a plurality of memory cells which need refresh; an access circuit for making an access to a memory cell designated by an access address externally supplied; a refresh clock signal generating circuit for generating a refresh clock signal which provides a reference to a time interval of refresh operations; an address transition detecting circuit for detecting a transition of the access address and generating an access address transition detecting signal; and a control circuit for activating a refresh enable signal for enabling a refresh operation based on a generation of the access address transition detecting signal by triggering the refresh clock signal, and for executing a refresh to a memory cell corresponding to a refresh address by triggering the generation of the access address transition detecting signal, prior to executing an access to a memory cell designated by the access address.

After the control circuit executes the refresh operation in a state that the refresh enable signal is activated, then the control circuit may inactivate the refresh enable signal in only a predetermined period of time based on the refresh clock signal, so that the control circuit discontinues the refresh operation by triggering the generation of the access address transition detecting signal.

The control circuit may be adopted to execute a refresh operation by triggering an input of a write instruction signal, independently from the refresh enable signal, before the control circuit executes a write operation to a memory cell designated by the access address.

The control circuit may be adopted to execute a refresh operation by triggering the write instruction signal and a subsequent write operation if the write instruction signal is inputted within a predetermined period of time which is defined to correspond to a maximum value of a time interval of transitions of the access address to the memory cells, and the predetermined period of time starts from a time of generation of the refresh clock signal.

If the control circuit executes the refresh by triggering the write instruction signal and the subsequent write operation, then the control circuit may be adopted to not activate the refresh enable signal by triggering a next-generated refresh clock signal, and upon an input of the access address transition detecting signal, the control circuit makes an access to a memory cell designated by the access address without refresh operation.

A time interval of transitions of the access address to the memory cell may be shorter than a cycle of the refresh clock signal.

An input circuit for inputting a chip select signal which selects the semiconductor memory device may further be provided, where the chip select signal is supplied externally; and the address transition detecting circuit detects either a transition of the access address to the memory cell, and the access address being supplied externally, or a transition of a chip select signal for generating the access address transition detecting signal.

A write instruction signal may be a pulse signal with a predetermined pulse width, and data of the memory cell are defined at an end timing of rising or falling of the pulse signal.

If any transition of the access address to the memory cell is not caused in a predetermined period of time based on the refresh clock signal, then the control circuit may be adopted to execute refresh operations to a memory cell corresponding to the refresh address at a predetermined cycle based on the refresh clock signal.

The present invention also provides a semiconductor memory device comprising: a memory cell array having a plurality of memory cells which need refresh; an access circuit for making an access to a memory cell designated by an access address externally supplied; a refresh address generating circuit for generating a refresh address which designates a memory cell being subject to refresh; and a control circuit executing a data read operation to a memory cell designated by the access address after a predetermined time has passed from a transition of the access address, and for subsequently executing a refresh operation of a memory cell corresponding to the refresh address, and for further executing a data write operation to a memory cell designated by the access address.

The present invention also provides a refresh operation control circuit for controlling refresh operations to memory cells, wherein the refresh operation control circuit generates a refresh clock signal which provides a reference to a time interval of refresh operations, and wherein the refresh operation control circuit controls executing a refresh operation generated in response to a transition of an access address by the refresh clock signal.

After the refresh operation is executed in response to a transition of the access address, then the refresh operation in response to the transition of the access address may not be executed in a predetermined period of time based on the refresh clock signal.

A refresh operation may be executed by triggering an input of a write instruction signal, independently from the refresh enable signal.

A refresh operation may be executed by triggering the write instruction signal if the write instruction signal is inputted within a predetermined period of time which is defined to correspond to a maximum value of a time interval of transitions of the access address to the memory cells, and the predetermined period of time starts from a time of generation of the refresh clock signal.

If the refresh is executed by triggering the write instruction signal and subsequently the refresh clock signal is generated, then a refresh operation in response to a transition of the access address may be omitted.

A time interval of transitions of the access address to the memory cell may be shorter than a cycle of the refresh clock signal.

If any transition of the access address to the memory cell is not caused in a predetermined period of time based on the refresh clock signal, then refresh operations may be executed at a predetermined cycle based on the refresh clock signal.

DETAILED DESCRIPTION OF THE VARIOUS EMBODIMENTS

Figure 1:
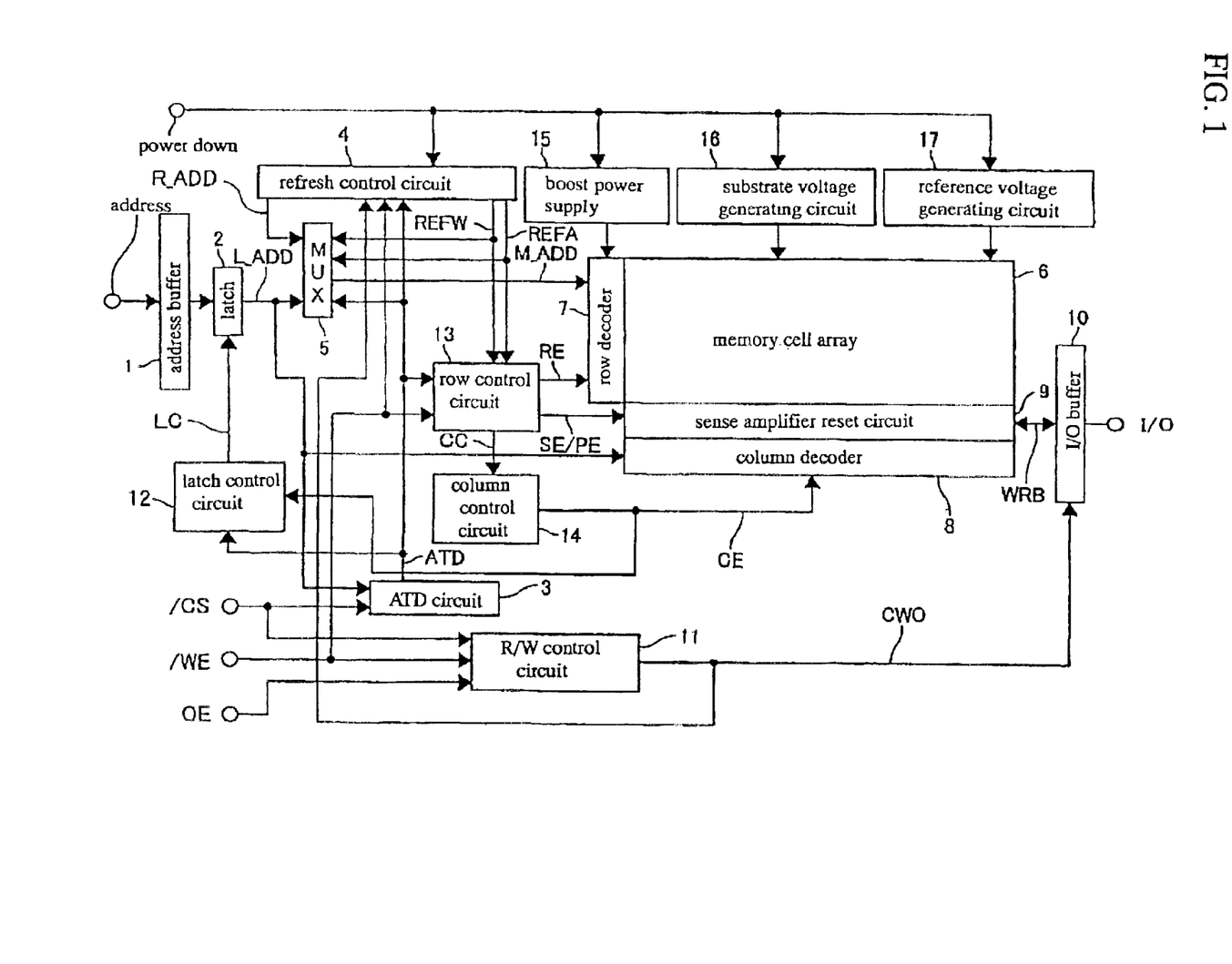
FIG. 1 is a block diagram illustrative of a configuration of a semiconductor memory device in one embodiment in accordance with the present invention.

Embodiments of the present invention will be described with reference to the drawings. FIG. 1 is a block diagram illustrative of the configuration of the semiconductor memory device in the present invention. In this drawing, an address "Address" is an access address which is supplied from an outside of the semiconductor memory device. The address "Address" includes a row address and a column address in response to an alignment in matrix of memory cells to be described below. An address buffer 1 buffers this address "Address" and outputs the same. A latch 2 captures the address supplied from the address buffer 1 at a rising time of a latch control signal LC and holds the address, and outputs the address as an internal address L_ADD in a period of time when the latch control signal LC is activated. In another period of time when the latch control signal LC is inactivated, then the output from the address buffer 1 is passed through the latch 2 and outputted as the internal address L_ADD.

An ATD (Address Transition Detector) circuit 3 outputs an address transition detecting signal ATD of one-shot pulse signal in response to any transition of at least any one of internal addresses L_ADD if a chip select signal /CS is effective ("L" level). The ATD circuit 3 also generates the address transition detecting signal ATD of one-shot pulse signal in response to a transition of a chip select signal /CS into an active state. The chip select signal /CS is a select signal which is made effective for making an access to the semiconductor memory device shown in FIG. 1. A symbol "/" put at a head of the signal name means a negative logic signal.

The ATD circuit 3 comprises combined logic circuits. The ATD circuit 3 generates one shot pulse to a first-transitioned bit of bits of the internal address L_ADD, and if any transition of any other bit than this first-transitioned bit appears in a period of time when this first one shot pulse is present, then the already generated one shot pule and a newly generated one shot pulse are synthesized. If the address "Address" has a skew, then a pulse width of the one shot pulse becomes longer by only this skew of the address "Address". It is impossible that one time transition of the address generates a plurality of one shot pulses. This makes it also impossible to raise any problem with breaking data of memory cells. The refresh is performed in a period of time when the address transition detecting signal ATD of one shot pulse is being outputted from the ATD circuit 3, for which reason a pulse width of this one shot pulse is preferably set to be longer than a necessary time for completing the refresh for one word line.

A refresh control circuit 4 integrates a refresh generating circuit 43 and a timer 41. The refresh control circuit 4 generates refresh control signals REFA and REFW by utilizing them and an address transition detecting signal ATD, a write enable signal /WE, and a control signal CWO, for controlling the refresh in the inside of the semiconductor memory device, whereby a refresh address and a refresh timing are automatically generated in the inside of the semiconductor memory device, resulting in the same refresh as a self-refresh of the general-purpose DRAM. The refresh generating circuit 43 sequentially generates refresh addresses R_ADD for refreshing DRAM memory cells. The refresh address R_ADD has the same bit width as a row address included in the address "Address".

In accordance with the address transition detecting signal ATD and the below described refresh control signals REFA and REFW, a multiplexer 5 ("MUX" in the drawing) selects a row address included in the internal address L_ADD and outputs the same as an address M_ADD either if the refresh control signal REFW is low level "L" and the address transition detecting signal ATD is low level "L" or if the refresh control signal REFA is low level "L". The multiplexer 5 selects refresh address R_ADD as the address M_ADD if the refresh control signal REFA is high level "H" and the address transition detecting signal ATD is high level "H" or if the refresh control signal REFW is high level "H".

A memory cell array 6 comprise the same memory cell array as those of the general-purpose DRAM, wherein word lines run in a row direction, and bit lines (bit line pairs) run in a column direction, and memory cells are aligned in matrix at crossing positions of the word lines and the bit lines, and each the memory cells comprises a pair of a single transistor and a single capacitor.

A row decoder 7 decodes the address M_ADD and activates a word line designated by this address M_ADD if a row enable signal RE is high level "H". If the row enable signal RE is low level "L", then the row decoder 7 does not activate any word line. A column decoder 8 decodes a column address included in the internal address L_ADD and generates a column selecting signal which selects a bit line designated by this internal address L_ADD if a column enable signal CE is high level "H". If the column enable signal CE is low level "L", then the column decoder 8 does not generate any column selecting signals corresponding to any bit lines.

A sense amplifier reset circuit 9 comprises sense amplifier column switches and pre-charge circuits, illustrations of which are omitted. The column switch connects a sense amplifier to a bus WRB, wherein this sense amplifier is designated by the column selecting signal outputted from the column decoder 8. If a sense amplifier enable signal SE is high level "H", the sense amplifier senses and amplifies a potential of a bit line connected to a memory cell designated by the address "Address" and then supplies the amplified potential to the bus WRB or writes write-data into the memory cell, wherein the write-data have been supplied from the bus BWR through the bit lines. The pre-charge circuit pre-charges the potential of the bit line to a predetermined potential (for example, ½ of a power voltage) if a pre-charge enable signal PE is high level "H".

An I/O (input/output) buffer 10 places an output buffer therein to a state of buffering read-out data on the bus WRB, and outputting the data through a bus I/O from the semiconductor memory device if a control signal CWO is high level "H". If the control signal CWO is low level "L" then the I/O (input/output) buffer 10 places the output buffer into a floating state, and places an input buffer therein into a state of buffering write data and sending the same to the bus WRB, wherein the write data have been supplied at the bus I/O from the outside of the semiconductor memory device. If the control signal CWO is high level "H", then the read out operation is taken place. If the control signal CWO is low level "L", Then the write operation is taken place. A R/W (read/write control circuit 11 generates the control signal CWO based on a chip select signal /CS, a write enable signal /WR and an output enable signal OE.

A latch control circuit 12 generates a latch control signal LC which decides a timing of latching the address "Address" based on the address transition detecting signal ATD and the column enable signal CE. A row control circuit 13 generates a row enable signal RE, a sense amplifier enable signal SE, a pre-charge enable signal PE and a control signal CC based on the refresh control signal REFA, the refresh control signal REFW, the address transition detecting signal ATD and the write enable signal /WE. A column control circuit 14 generates a column enable signal CE based on this control signal CC.

A boost power supply 15 is a power supply for supplying the row decoder 7 with a boosted voltage which is to be supplied to word lines in the memory cell array 6. A substrate voltage generating circuit 16 is a circuit for generating a substrate voltage which is to be applied to a well or a semiconductor substrate, over which each memory cells of the memory cell array 6 are formed. A refresh voltage generating circuit 17 generates a refresh voltage (for example, ½ of a power voltage=½ Vcc) which is to be used by the memory cell array 6 and sense amplifiers, pre-charge circuits and equalize circuits in the sense amplifier reset circuit 9.

A power down control signal "Power Down" is supplied to the refresh control circuit 4, the boost power supply 15, the substrate voltage generating circuit 16 and the reference voltage generating circuit 17. This power down control signal "Power Down" is a signal for externally designating a mode of placing the semiconductor memory device into a power down state (a stand-by state).

In accordance with the present embodiments, the memory cells are the same as those of DRAM, for which reason it is inhibited that the power supply to each circuit in the semiconductor memory device is simply discontinued in the stand-by state similarly to SRAM. It is necessary to continue the power supply to circuits which are needed for refresh operations in order to hold data of the memory cells even in the stand-by state. The semiconductor memory device of this embodiment is not completely compatible to SRAM in the stand-by state. Notwithstanding, the semiconductor memory device has some modes in the stand-by state for taking the compatibility to SRAM as many as possible, wherein the modes include other modes than the existent modes of SRAM.

Namely, in accordance with the present embodiment, three kinds of stand-by modes 1~3 are provided other than the normal operation modes. In the stand-by mode 1, the power is supplied to all of the refresh control circuit 4, the boost power supply 15, the substrate voltage generating circuit 16 and the reference voltage generating circuit 17 for allowing the refresh operation even if the chip select signal /CS is invalid (null) which places it into the stand-by state. In the stand-by mode 2, the power supply to the refresh control circuit 4 only is discontinued while the power supply is continued to the remaining three circuits, for discontinuing the refresh operation in the stand-by state. In the stand-by state 3, the power supplies to all of the above four kinds of the circuits are discontinued for discontinuing all of the power supplies to the circuits unnecessary in the stand-by state.

Provisions of the above-described stand-by modes allow external precise controls to the semiconductor memory device, for example, to the issue of need or non-need to hold data in the stand-by state, a return time to the active state, and a current consumption in accordance with an instrument, to which the semiconductor memory device is applied, and also with an environment in use of the semiconductor memory device. The power down control signal "Power Down" is not essential function, for which reason this may be omitted for a complete compatibility of the I/O pins with those of the general-purpose SRAM.

Subsequently, the configuration of the refresh control circuit 4 shown in FIG. 1 will be described with reference to FIG. 2. The refresh control circuit 4 shown in FIG. 2 comprises a timer 42, a controller 42 and a refresh generating circuit 43, wherein the timer 42 generates a refresh clock signal which provides a reference of a time interval for a batch-refresh operation with addresses corresponding to a unit of row (a single row in this embodiment), and wherein the controller 42 generates refresh control signals REFA and REFW based on the refresh clock signal, the address transition detecting signal ATD, the write enable signal /WE and the control signal CWO, and wherein the refresh generating circuit 43 sequentially updates and generates the refresh addresses R_ADD with counting the time of generation of control signals which instruct execution of the refresh operations., where the control signals are supplied from the controller 42.

The refresh control signal REFA is a signal for controlling whether or not the refresh operation is executed in accordance with an access request from the outside of the semiconductor memory device. If this signal is high level "H", then the refresh operation is permitted, whereby the row enable signal RE of one shot pulse is generated at a rising of the address transition detecting signal ATD generated by the access request, for starting the refresh. If this signal is low level "L", then the generation of the one shot pulse of the address transition detecting signal ATD does not cause one shot pulse on the row enable signal RE. The refresh control signal REFA is also a signal for a self-refresh to be executed based on the refresh clock signal. In this embodiment, however, the refresh operation is controlled at a timing of activation of the write enable signal /WE by use of the refresh control signal REFW. Further, a necessary refresh is executed if no access is made in a cycle Tr (see FIG. 3) of an output from the timer. Providing one shot pulse to the refresh control signal REFW forcibly generates one shot pulse on the row enable signal for starting the refresh.

Figure 2:
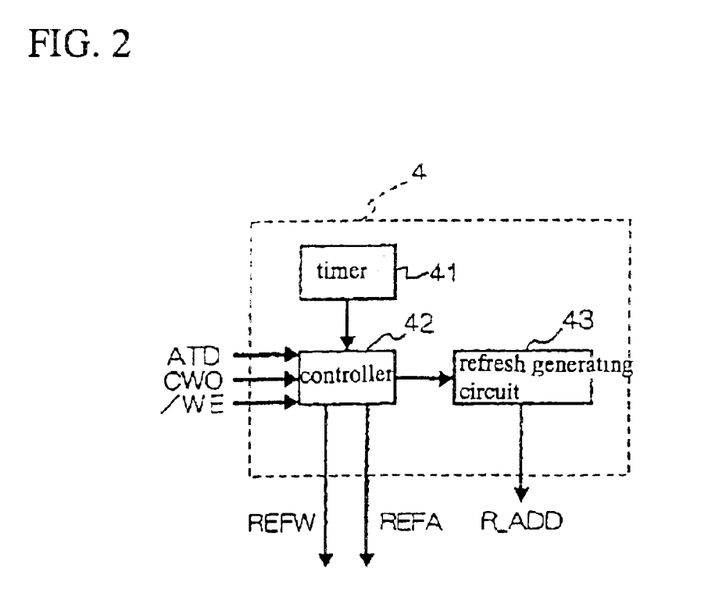
FIG. 2 is a circuit diagram illustrative of a detailed configuration of an essential part of the semiconductor memory device in the same embodiment.

In FIG. 2, illustration of the configuration responsible to the other control signals such as the power down control signal. "Power Down" is omitted.

Figure 3:
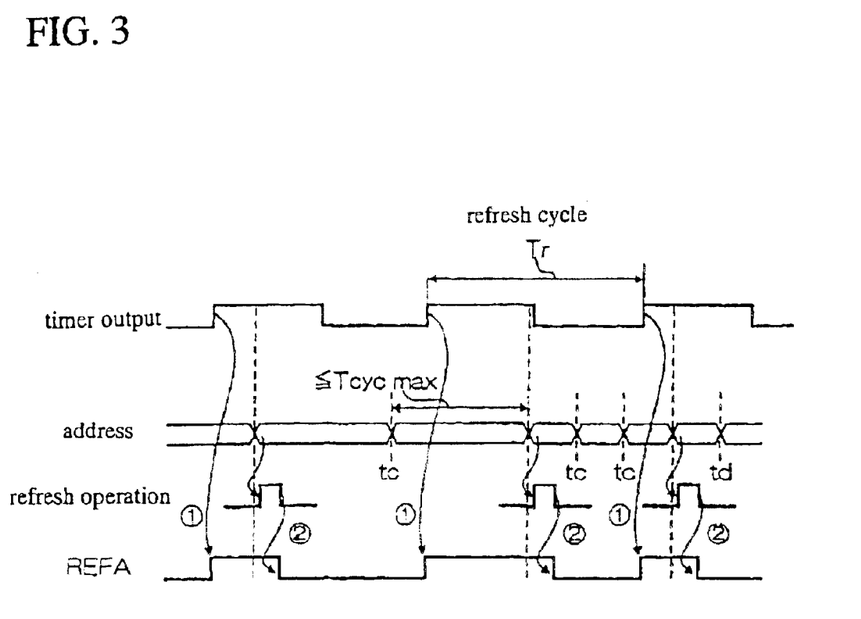
FIG. 3 is a timing chart illustrative of operations of the semiconductor memory device in the same embodiment, wherein a refresh is taken place by a refresh control signal REFA.
Figure 4:
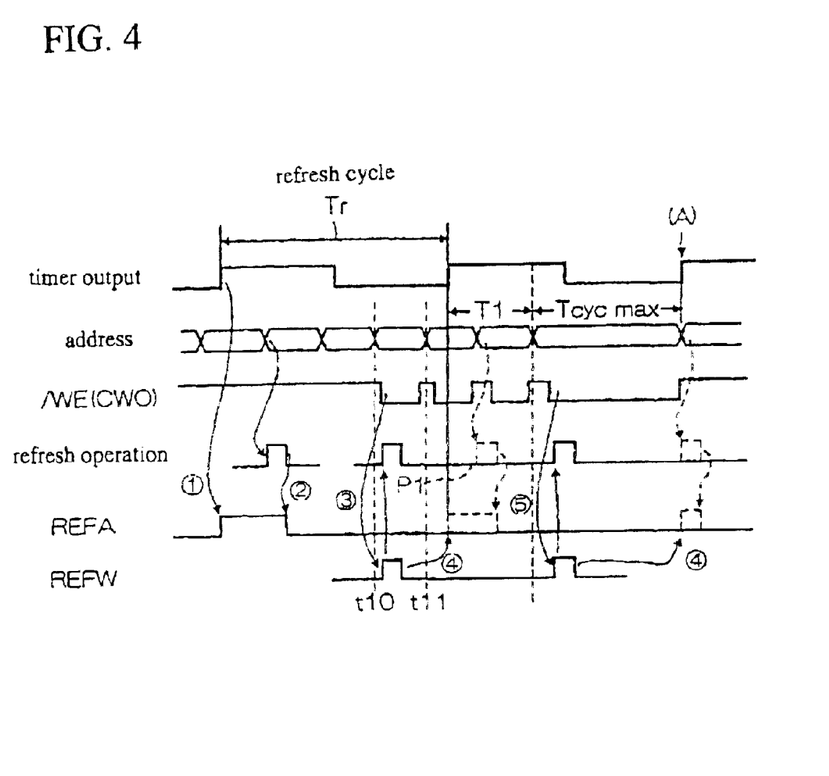
FIG. 4 is a timing chart illustrative of operations of the semiconductor memory device in the same embodiment, wherein a refresh is taken place by a refresh control signal REFW in accordance with an input of a write enable signal /WE.

The refresh operations controlled by the refresh control circuit 4 will be described with reference to FIGS. 3 and 4. FIG. 3 is a timing chart showing, sequentially from the top, an output from the timer 41, the address "Address", the timings of the refresh operation, and the refresh control signal REFA in data read operations, wherein the chip select signal /CS not illustrated is low level "L" and this chip is selected. FIG. 4 is a timing chart showing, sequentially from the top, the output from the timer 41, the address "Address", the write enable signal /WE, the timings of the refresh operation, and the refresh control signals REFA and REFW in data write operations in accordance with the write enable signal, wherein the chip select signal /CS not illustrated is low level "L" and this chip is selected. The write enable signal /WE is an external signal which instructs to write data at the low level "L". In accordance with the present embodiment, the data write (store) operation is started at a falling edge of the write enable signal /WE, while the data are defined at a rising edge thereof.

The cycle Tr of the output from the timer shown in FIG. 3 is so set that execution of refreshes for single-row addresses one time in one cycle allows data of all the memory cells to be held. In the example of FIG. 3, a time interval of plural transitions of the address signal "Address" externally entered is so set as being shorter than a maximum memory access cycle "Tcyc max". The maximum memory access cycle "Tcyc max" defines a maximum value of an interval adjacent two of plural accesses which are continuously made, and the maximum memory access cycle "Tcyc max" is so set as being shorter than the cycle Tr of the output from the timer. Execution of refresh one time in the average in the cycle Tr of the output from the timer causes sufficient times in total of the refresh. In the present embodiment, the refresh control signal REFA is controlled to become high level "H" in the first cycle Tr as a first timing. If the refresh is executed one time within this cycle, then the refresh control signal REFA is transitioned from the high level "H" to the low level "L", and no refresh is executed until the refresh control signal REFA is again transitioned to the high level "H" in the next cycle Tr. The control to the total number of the refresh times is not limited to this embodiment. Illustrations are not made in FIGS. 3 and 4, if no address transition is caused in the cycle Tr, then the refresh control signal REFW is generated at the last timing of this cycle for executing a self-refresh.

In FIG. 3, (1) represents a timing of setting the refresh control signal REFA at the high level "H" based on the output from the timer, thereby permitting execution of the refresh with one shot pulse of the address transition detecting signal AD not illustrated in the drawings and showing the transition of the address "Address". (2) represents a timing of resetting the refresh control signal REFA at the low level "L" because no further refresh is necessary after the refresh has been executed by triggering the transition of the address "Address" (by one shot pulse of the address transition detecting signal ATD not illustrated in the drawings). In FIG. 3, transitions of the address "Address" appear at timings "tc", "tc" - - - "td". Notwithstanding, no refresh is executed because the refresh control signal REFA is low level "L" at those timings.

Subsequently, refresh operations in data write will be described with reference to FIG. 4. In an example shown in FIG. 4, the data read operation is executed in a period of time when the write enable signal /WE (or the control signal CWO) is high level "H", while the data write operation is executed in another period of time when the write enable signal /WE is low level "L". At the timings (1) and (2) in FIG. 4, the same operations are made at the timings (1) and (2) in FIG. 3. At the timing (3), one shot pulse of the refresh control signal REFW is generated in synchronizing with a falling of the write enable signal /WE, and the refresh operation is executed synchronizing with the generation of the refresh control signal REFW. In this case, the refresh operations have already been executed at the timings (1) and (2) in the same cycle Tr of the timer output based on the refresh control signal REFA At the first tiling of transition of the write enable signal /WE from the read to the write, the refresh control signal REFW is generated for forcibly executing the refresh operation. The refresh operation at this timing (3) may be considered to be in advance the refresh operation in the next cycle Tr of the time output, for which reason at start of the timer output (the timing (4)), the refresh control signal REFA is set at the low level "L". The refresh operation is discontinued in the next cycle Tr of the timer output. For example, no refresh operation is executed at the timing of a pulse P1.

The refresh at the timing (3) has made unnecessary an execution of the refresh, and the execution of the refresh in the cycle of the timer output is still unnecessary at the timing (5). For a write operation generated in a maximum memory access cycle "Tcyc max" from a start trigger (A) of the next cycle, a refresh control signal REFW is generated by triggering a falling of the write enable signal /WE for executing the refresh. Namely, if the falling of the write enable signal /WE appears after a time T1 has passed from a start time of each timer output cycle Tr, then the refresh control signal REFW is generated even the refresh control signal FERA is low level "L", wherein T1 is a time corresponding to a value obtained by subtracting the maximum memory access cycle "Tcyc max" from the cycle Tr of the timer output (T1=the timer output cycle Tr−the maximum memory access cycle "Tcyc max"), whereby no refresh is executed based on the refresh control signal REFA and the address transition detecting signal ATD during the continuous data write operation (during repeating data write operations in the maximum memory access cycle "Tcyc max"). The timing of generating the refresh control signal REFW is not limited to a period of time defined by the maximum memory access cycle "Tcyc max" as described above. It is possible that the refresh control signal REFW is generated before the above timing, for example, in each refresh cycle, the refresh control signal REFW is generated at a falling of any write enable signal /WE which enters after a refresh and a read or write operation associated with the refresh have been executed, wherein the refresh is started when the refresh control signal REFA is high level "H".

Figure 5:
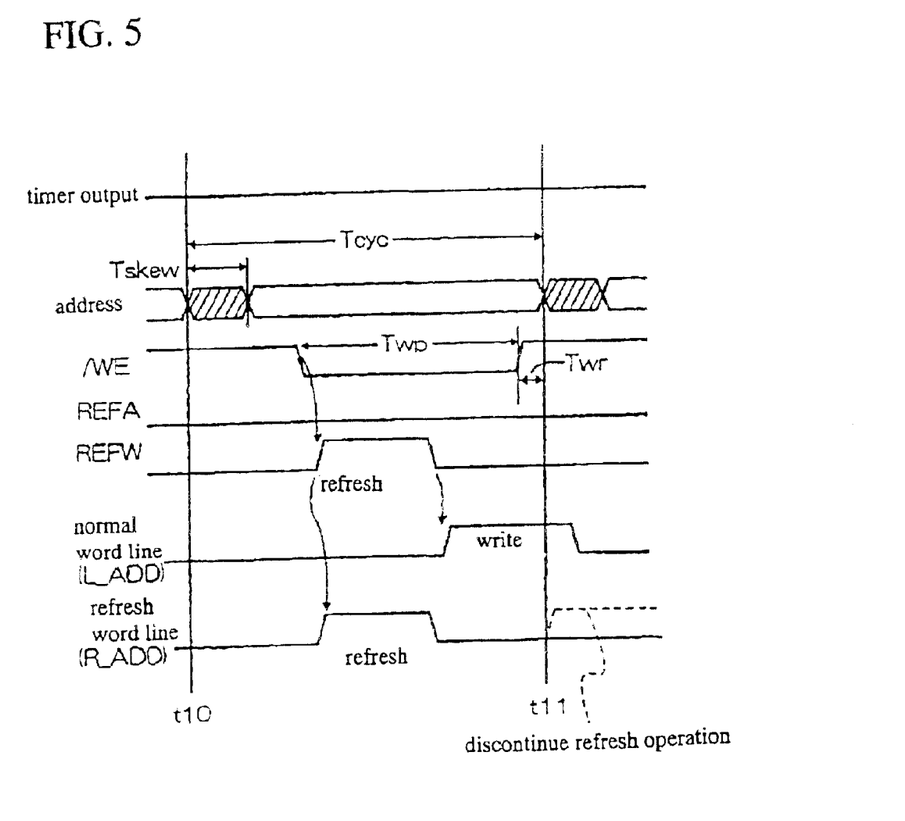
FIG. 5 is a timing chart showing details of operations shown in FIG. 4 of the semiconductor memory device in the same embodiment.

Data write operations at times t10~t11 shown in FIG. 4 will be described with reference to FIG. 5 in details. FIG. 5 is a timing chart illustrative of waveforms of signals in operations at times t10~t11 in FIG. 4. Normal word line is a word line for data write operation. Refresh word line is a word line for refresh operation. The normal word line is designated by the internal address L_ADD. The refresh word line is designated by the refresh address R_ADD. In FIG. 5, the normal word line and the refresh word line are separate from each other. Notwithstanding, the normal word line and the refresh word line are the same word line. The refresh control signal REFW is risen in synchronizing with a falling of the write enable signal /WE, whereby the refresh word line is activated in synchronizing with the rising of the refresh control signal REFW, so that plural memory cells connected to the word line activated are batch-refreshed. The refresh control signal REFW is fallen, then the normal word line is activated in synchronizing with this falling of the refresh control signal REFW. At a time of rising of the write enable signal /WE, data of the memory cell are defined by data which have been supplied through the sense amplifier and the bit lines from the bus WRB.

In FIG. 5, Tcyc represents the memory access cycle. Twp represents a write pulse width. Tskew is an address skew time. Twr is an address hold time. In the present embodiment, at a next address transition point after the ata write operation (a time t11 in FIG. 5), the refresh by the refresh control signal REFA is discontinued, whereby the address transition marked by a broken line depending on the refresh operation is not caused. Even if the address hold time Twr is 0 second, data definition operations are stably executed in synchronizing with the rising of the write enable signal /WE.

Other mode of controlling the data access in the semiconductor memory device in accordance with the present invention will be described with reference to FIG. 6. The timing chart shown in FIG. 6 illustrates the read operation and the write operation in upper half and lower half regions, with correspondence to the common timings of the transitions of the address "Address".

Figure 6:
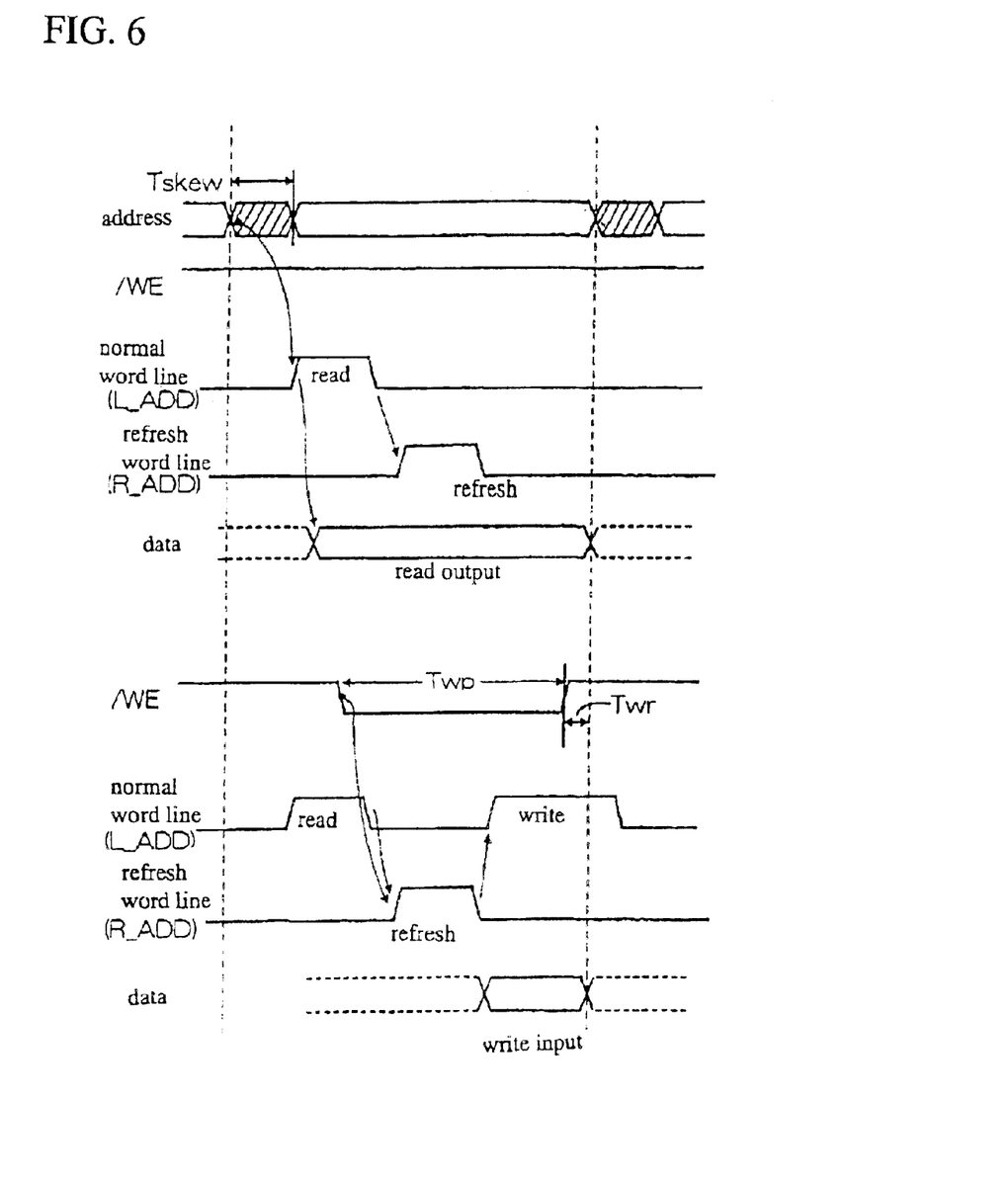
FIG. 6 is a timing chart showing other access control timing in the semiconductor memory device in accordance with the present invention.

In the operations shown in FIG. 6, if the write enable signal /WE is in the inactive state ("H" level) at a time when the skew (Tskew) of the address "Address" is Completed, then an access based on the external address "Address" is considered to be "read", and the read operation is commenced. If the write enable signal /WE is not activated and remains in the present state, then the normal word lime is activated based on the internal address L_ADD, whereby the data read operation is executed, and data are outputted. After a predetermined time necessary for the data read operation has passed from the start of access based on the internal address L_ADD, then the refresh operation is executed to the refresh word line designated by the refresh address R_ADD.

If the write enable signal /WE is activated subsequently, then the normal word line is activated by the internal address L_ADD, for execution of the data read operation, before the refresh operation is then executed to the refresh word line designated by the refresh address R_ADD. After a time necessary for the refresh operation has passed, the data write operation to the memory cell designated by the internal address L_ADD is executed.

As described above, in accordance with the operations shown in FIG. 6, similarly to the above-described embodiment, the refresh operation is executed prior to the data write operation, for which reason it is possible that the address hold time (Twr) in the data write operation is almost zero. Further, in the present embodiment, the read operation is started at the time when the address skew has been completed, and the refresh operation is executed after the data read operation, thereby shortening an access time in the read operation.

The timing control to the refresh operation described in the above embodiments may be applicable to the existent semiconductor memory devices such as the conventional pseudo SRAM and the general-purpose DRAM. The application of the timing control to the refresh operation is not limited to the pseudo SRAM having the same specification as the general-purpose SRAM. In the above-described embodiment, the write enable signal /WE is the negative logic and the refresh is executed depending upon the falling edge of the pulse signal. It is also possible to invert the logic of the pulse signal, so that the refresh is executed depending upon the rising edge of the pule signal. This may be similar to the other signals than the write enable signal, such as the address transition detecting signal.

Further, an entirety of the circuits of the semiconductor memory device comprising the memory cell array and peripheral circuits may be mounted on a single chip. The entirety of the circuits may also be divided into some function blocks which are mounted on separate chips. In the later case, it is possible that the memory cell array and the peripheral circuits are mounted on separate chips to form a hybrid IC. It is also possible that only a refresh control circuit 4 in the peripheral circuits is mounted on a separate chip from a memory chip to form another hybrid IC.

Whereas the embodiments of the present invention has been described above, the present invention is not limited to those embodiments, and design modifications without beyond the subject matters of the invention are included in the present invention.

INDUSTRIAL APPLICABILITY

As described above, in accordance with the present invention, there are provided a refresh clock signal generating circuit for generating a refresh clock signal which provides a reference to a time interval of refresh operations, an address transition detecting circuit detecting a transition of an access address and generating an access address transition detecting signal, and a control circuit for activating a refresh enable signal for enabling a refresh operation based on the generation of the access address transition detecting signal by triggering the refresh clock signal, and for refreshing a memory cell corresponding to a refresh address by triggering the generation of the access address transition detecting signal prior to an execution of an access to a memory cell designated by an access address. This does not cause any problems that the refresh provides any influence to the normal access, and that the continuous access inhibits the refresh.

In accordance with the present invention, a refresh operation is executed in a state that the above refresh enable signal is activated, before the refresh enable signal becomes inactivated in only a predetermined period of time based on the refresh clock signal, so that the refresh operation by triggering the generation of the access address transition detecting signal is discontinued. This results in that refresh operations of subsequent accesses are not executed at times of address transitions. This makes it possible that the specification of the address hold time Twr in the data write operation is equivalent to that of the general-purpose SRAM.

In another embodiment of the present invention, a control circuit is provided such that after a predetermined time has passed from a transition of the access address, then a data read operation is executed to a memory cell designated by this access address, and subsequently a refresh operation is executed to a memory cell corresponding to a refresh address, and a data write operation is executed to a memory cell designated by an access address. This results in that refresh operations of subsequent accesses are not executed at times of address transitions, and it is possible that the specification of the address hold time Twr in the data write operation is equivalent to that of the general-purpose SRAM. the read operation is started from the time of completion of the address skew for shortening the access time in the read operation.

What is claimed is:

1. A semiconductor memory device comprising:
   a memory cell array having a plurality of memory cells which need refresh;
   an access circuit for making an access to a memory cell designated by an access address externally supplied;
   a refresh clock signal generating circuit for generating a refresh clock signal which provides a reference to a time interval of refresh operations;
   an address transition detecting circuit for detecting a transition of said access address and generating an access address transition detecting signal; and
   a control circuit for activating a refresh enable signal for enabling a refresh operation based on a generation of said access address transition detecting signal by triggering said refresh clock signal, and for executing a refresh to a memory cell corresponding to a refresh address by triggering the generation of said access address transition detecting signal, prior to executing an access to a memory cell designated by said access address,
   wherein said control circuit executes a refresh operation by triggering an input of a write instruction signal, independently from said refresh enable signal, before said control circuit executes a write operation to a memory cell designated by said access address.

2. The semiconductor memory device as claimed in claim 1, wherein after said control circuit executes said refresh operation in a state that said refresh enable signal is activated, then said control circuit inactivates said refresh enable signal in only a predetermined period of time based on said refresh clock signal, so that said control circuit discontinues said refresh operation by triggering the generation of said access address transition detecting signal.

3. The semiconductor memory device as claimed in claim 1, wherein said control circuit executes a refresh operation by triggering said write instruction signal and a subsequent write operation if said write instruction signal is inputted within a predetermined period of time which is defined to correspond to a maximum value of a time interval of transitions of said access address to said memory cells, and said predetermined period of time starts from a time of generation of said refresh clock signal.

4. The semiconductor memory device as claimed in claim 1, wherein if said control circuit executes said refresh by triggering said write instruction signal and said subsequent write operation, then said control circuit does not activate said refresh enable signal by triggering a next-generated refresh clock signal, and upon an input of said access address transition detecting signal, said control circuit makes an access to a memory cell designated by said access address without refresh operation.

5. The semiconductor memory device as claimed in claim 1, wherein a time interval of transitions of said access address to said memory cell is shorter than a cycle of said refresh clock signal.

6. The semiconductor memory device as claimed in claim 1, further comprising:
   an input circuit for inputting a chip select signal which selects said semiconductor memory device; where said chip select signal being supplied externally; and
   wherein said address transition detecting circuit detects either a transition of said access address to said memory cell, and said access address being supplied externally, or a transition of a chip select signal for generating said access address transition detecting signal.

7. The semiconductor memory device as claimed in claim 1, wherein a write instruction signal is a pulse signal with a predetermined pulse width, and data of said memory cell are defined at an end timing of rising or falling of said pulse signal.

8. The semiconductor memory device as claimed in claim 1, wherein if any transition of said access address to said memory cell is not caused in a predetermined period of time based on said refresh clock signal, then said control circuit executes refresh operations to a memory cell corresponding to said refresh address at a predetermined cycle based on said refresh clock signal.

9. A semiconductor memory device comprising:
   a memory cell array having a plurality of memory cells which need refresh;
   an access circuit for making an access to a memory cell designated by an access address externally supplied;
   a refresh address generating circuit for generating a refresh address which designates a memory cell being subject to refresh; and
   a control circuit executing a data read operation to a memory cell designated by said access address after a predetermined time has passed from a transition of said access address, and for subsequently executing a refresh operation of a memory cell corresponding to said refresh address, and for further executing a data write operation to a memory cell designated by said access address.

10. A refresh operation control method for a semiconductor memory device having memory cells needing refresh, said method comprising:
   activating a refresh enable signal by triggering a refresh clock signal which provides a reference to a time interval of refresh operations;
   taking place a refresh operation by triggering a transition of an access address if said refresh enable signal is in an activated state; and
   taking place no refresh operation even by a transition of said access address if said refresh enable signal is in an inactivated state,
   wherein a refresh operation is executed by triggering an input of a write instruction signal, independently from said refresh enable signal.

11. The refresh operation control method for said semiconductor memory device as claimed in claim 10, wherein a refresh operation is executed by triggering said write instruction signal if said write instruction signal is inputted within a predetermined period of time which is defined to correspond to a maximum value of a time interval of transitions of said access address to said memory cells, and said predetermined period of time starts from a time of generation of said refresh clock signal.

12. The refresh operation control method for said semiconductor memory device as claimed in claim 10, wherein if said refresh is executed by triggering said write instruction signal, then an activation of said refresh enable signal by triggering a next-generated refresh clock signal is omitted.

13. The refresh operation control method for said semiconductor memory device as claimed in claim 10, wherein a time interval of transitions of said access address to said memory cell is shorter than a cycle of said refresh clock signal.

14. The refresh operation control method for said semiconductor memory device as claimed in claim 10, wherein if any transition of said access address is not caused in a predetermined period of time based on said refresh clock signal, then refresh operations are executed at a predetermined cycle based on said refresh clock signal.

* * * * *